(12) United States Patent
Chung et al.

(10) Patent No.: US 7,917,827 B2
(45) Date of Patent: Mar. 29, 2011

(54) METHOD OF ENCODING AND DECODING USING LDPC CODE AND APPARATUS THEREOF

(75) Inventors: Kyu Hyuk Chung, Seoul (KR); Min Seok Oh, Seoul (KR)

(73) Assignee: LG Electronics Inc., Seoul (KR)

( * ) Notice: Subject to any disclaimer, the term of this patent is extended or adjusted under 35 U.S.C. 154(b) by 526 days.

(21) Appl. No.: 11/575,494

(22) PCT Filed: Sep. 14, 2005

(86) PCT No.: PCT/KR2005/003041
§ 371 (c)(1),
(2), (4) Date: Jul. 14, 2008

(87) PCT Pub. No.: WO2006/031062
PCT Pub. Date: Mar. 23, 2006

(65) Prior Publication Data
US 2008/0270867 A1    Oct. 30, 2008

(30) Foreign Application Priority Data

Sep. 17, 2004  (KR) .................. 10-2004-0074732
Sep. 24, 2004  (KR) .................. 10-2004-0077013

(51) Int. Cl.
*H03M 13/00*  (2006.01)
(52) U.S. Cl. ...................................... 714/752
(58) Field of Classification Search ............ 714/752
See application file for complete search history.

(56) References Cited

U.S. PATENT DOCUMENTS

| | | | |
|---|---|---|---|
| 7,260,763 B2 * | 8/2007 | Sukhobok et al. | 714/758 |
| 2004/0034828 A1 | 2/2004 | Hocevar | |
| 2004/0221223 A1 * | 11/2004 | Yu et al. | 714/800 |
| 2005/0201315 A1 * | 9/2005 | Lakkis | 370/315 |
| 2010/0153812 A1 * | 6/2010 | Jin et al. | 714/752 |

FOREIGN PATENT DOCUMENTS

| | | |
|---|---|---|
| CN | 1499731 | 5/2004 |
| WO | 2004/006444 | 1/2004 |
| WO | WO 2004/019268 | 3/2004 |

OTHER PUBLICATIONS

R. Echard et al. "Irregular/spl/pi-rotation LDPC codes" GLOBECOM '02. 2002-IEEE Global Telecommunication Conference.

* cited by examiner

*Primary Examiner* — Scott T Baderman
*Assistant Examiner* — Enam Ahmed
(74) *Attorney, Agent, or Firm* — Lee, Hong, Degerman, Kang & Waimey

(57) ABSTRACT

A method of encoding/decoding using an LDPC code and apparatus thereof are disclosed, by which a memory for storing a parity check matrix can be saved. The present invention includes generating a parity check matrix by expanding a base matrix including a permutation type defining a permutation matrix as at least one element, wherein the permutation matrix is generated from permutating a sequence of at least one of rows and columns of at least one base permutation matrix or rotating the at least one base permutation matrix and encoding or decoding the input data using the parity check matrix.

6 Claims, 11 Drawing Sheets

FIG. 2

$$H = \begin{bmatrix} P_{0,0} & P_{0,1} & P_{0,2} & \cdots & P_{0,n_b-2} & P_{0,n_b-2} \\ P_{1,0} & P_{1,1} & P_{1,2} & \cdots & P_{1,n_b-2} & P_{1,n_b-1} \\ P_{2,0} & P_{2,1} & P_{2,2} & \cdots & P_{2,n_b-2} & P_{2,n_b-1} \\ \vdots & \vdots & \vdots & \cdots & \vdots & \vdots \\ P_{m_b-1,0} & P_{m_b-1,1} & P_{m_b-1,2} & \cdots & P_{m_b-1,n_b-2} & P_{m_b-1,n_b-1} \end{bmatrix} = P^{H_b}$$

| 0 | 0 | 0 | 1 | 0 |
|---|---|---|---|---|
| 0 | 1 | 0 | 0 | 0 |
| 1 | 0 | 0 | 0 | 0 |
| 0 | 0 | 1 | 0 | 0 |
| 0 | 0 | 0 | 0 | 1 |

Base permutation matrix

FIG. 7B

| (2,0,0,0) | (0,1,1,0) | (2,0,1,0) | (-1) |
|---|---|---|---|
| (3,2,0,1) | (0,1,2,0) | (-1) | (0,1,1,0) |

Base matrix $H_b$

FIG. 7C

| 0 | 0 | 0 | 0 | 0 | 0 | 0 | 0 | 0 | 1 |
|---|---|---|---|---|---|---|---|---|---|
| 0 | 0 | 0 | 0 | 0 | 0 | 1 | 0 | 0 | 0 |
| 0 | 0 | 0 | 0 | 0 | 0 | 0 | 0 | 1 | 0 |
| 0 | 0 | 0 | 0 | 0 | 0 | 0 | 1 | 0 | 0 |
| 0 | 0 | 0 | 0 | 0 | 1 | 0 | 0 | 0 | 0 |
| 0 | 1 | 0 | 0 | 0 | 0 | 0 | 0 | 0 | 0 |
| 0 | 0 | 1 | 0 | 0 | 0 | 0 | 0 | 0 | 0 |
| 1 | 0 | 0 | 0 | 0 | 0 | 0 | 0 | 0 | 0 |
| 0 | 0 | 0 | 0 | 1 | 0 | 0 | 0 | 0 | 0 |
| 0 | 0 | 0 | 1 | 0 | 0 | 0 | 0 | 0 | 0 |
| 0 | 0 | 0 | 0 | 1 | 0 | 0 | 0 | 0 | 1 |
| 0 | 1 | 0 | 0 | 0 | 0 | 1 | 0 | 0 | 0 |
| 0 | 0 | 0 | 1 | 0 | 0 | 0 | 1 | 0 | 0 |
| 0 | 0 | 1 | 0 | 0 | 1 | 0 | 0 | 0 | 0 |
| 1 | 0 | 0 | 0 | 0 | 0 | 0 | 0 | 1 | 0 |
| 0 | 1 | 0 | 0 | 0 | 0 | 1 | 0 | 0 | 0 |
| 0 | 0 | 1 | 0 | 0 | 0 | 0 | 0 | 1 | 0 |
| 1 | 0 | 0 | 0 | 0 | 0 | 0 | 0 | 0 | 1 |
| 0 | 0 | 0 | 1 | 0 | 1 | 0 | 0 | 0 | 0 |
| 0 | 0 | 0 | 0 | 1 | 0 | 0 | 1 | 0 | 0 |

Parity check matrix H

FIG. 8A

| 0 | 0 | 0 | 1 | 0 |
|---|---|---|---|---|
| 0 | 1 | 0 | 0 | 0 |
| 1 | 0 | 0 | 0 | 0 |
| 0 | 0 | 1 | 0 | 0 |
| 0 | 0 | 0 | 0 | 1 |

$n_o=0$

| 1 | 0 | 0 | 0 | 0 |
|---|---|---|---|---|
| 0 | 1 | 0 | 0 | 0 |
| 0 | 0 | 1 | 0 | 0 |
| 0 | 0 | 0 | 1 | 0 |
| 0 | 0 | 0 | 0 | 1 |

$n_o=1$

Base permutation matrix

FIG. 8B

| (0,2,0,0,0) | (0,0,1,1,0) | (1,0,0,0,0) | (1,0,0,0,0) |
|---|---|---|---|
| (0,3,2,0,1) | (0,0,1,2,0) | (-1) | (1,0,0,0,0) |

Base matrix $H_b$

FIG. 8C — Parity check matrix H

| 0 | 0 | 0 | 0 | 1 | 0 | 0 | 0 | 0 | 1 |
|---|---|---|---|---|---|---|---|---|---|
| 0 | 0 | 0 | 1 | 0 | 0 | 0 | 0 | 1 | 0 |
| 0 | 0 | 1 | 0 | 0 | 0 | 0 | 1 | 0 | 0 |
| 0 | 1 | 0 | 0 | 0 | 0 | 1 | 0 | 0 | 0 |
| 1 | 0 | 0 | 0 | 0 | 1 | 0 | 0 | 0 | 0 |
| 0 | 0 | 0 | 0 | 1 | 0 | 0 | 0 | 0 | 0 |
| 0 | 0 | 0 | 1 | 0 | 0 | 0 | 0 | 0 | 0 |
| 0 | 0 | 1 | 0 | 0 | 0 | 0 | 0 | 0 | 0 |
| 0 | 1 | 0 | 0 | 0 | 0 | 0 | 0 | 0 | 0 |
| 1 | 0 | 0 | 0 | 0 | 0 | 0 | 0 | 0 | 0 |
| 0 | 0 | 0 | 1 | 0 | 0 | 0 | 0 | 0 | 1 |
| 0 | 1 | 0 | 0 | 0 | 0 | 1 | 0 | 0 | 0 |
| 0 | 0 | 0 | 1 | 0 | 0 | 0 | 1 | 0 | 0 |
| 0 | 0 | 1 | 0 | 0 | 1 | 0 | 0 | 0 | 0 |
| 1 | 0 | 0 | 0 | 0 | 0 | 0 | 0 | 1 | 0 |
| 0 | 1 | 0 | 0 | 0 | 0 | 1 | 0 | 0 | 0 |
| 0 | 0 | 1 | 0 | 0 | 0 | 0 | 1 | 0 | 0 |
| 1 | 0 | 0 | 0 | 0 | 0 | 0 | 0 | 0 | 1 |
| 0 | 0 | 0 | 1 | 0 | 1 | 0 | 0 | 0 | 0 |
| 0 | 0 | 0 | 0 | 1 | 0 | 0 | 1 | 0 | 0 |

METHOD OF ENCODING AND DECODING USING LDPC CODE AND APPARATUS THEREOF

CROSS-REFERENCE TO RELATED APPLICATIONS

This application is a national stage application of PCT Application No. PCT/KR2005/003041, filed on Sep. 14, 2005 which claims the benefit of earlier filing date and right of priority to Korean Application No. 10-2004-0074732, filed on Sep. 17, 2004, and Korean Application No. 10-2004-0077013, filed on Sep. 24, 2004, the contents of which are hereby incorporated by reference herein in their entirety.

TECHNICAL FIELD

The present invention relates to an encoding/decoding method, and more particularly, to a method of encoding/decoding using an LDPC code, method of generating an LDPC code for encoding or decoding and apparatus for encoding and decoding. Although the present invention is suitable for a wide scope of applications, it is particularly suitable for saving a memory for storing a parity check matrix required for the method of encoding and decoding using the LDPC (low density parity check) code and for enhancing encoding or decoding performance.

BACKGROUND ART

Generally, encoding is a process that a transmitting side performs a data processing for a receiving side to restore original data despite errors caused by signal distortion, loss and the like while the transmitting side transmits data via a communication channel. And, decoding is a process that the receiving side restores the encoded transmitted data into the original data.

Recently, many attentions are paid to an encoding method using an LDPC code. The LDPC code is a linear block code having low density since most of elements of a parity check matrix H are zeros, which was proposed by Gallager in 1962. It was difficult to implement the LDPC code that is very complicated due to the technological difficulty in those days. Yet, the LDPC code was taken into re-consideration in 1995 so that its superior performance has been verified. So, many efforts are made to research and develop the LPDC code. (Reference: [1] Robert G. Gallager, "Low-Density Parity-Check Codes", The MIT Press, Sep. 15, 1963. [2] D. J. C. Mackay, Good error-correcting codes based on very sparse matrices, IEEE Trans. Inform. Theory, IT-45, pp. 399-431 (1999))

Since the number of 1s of the parity check matrix of the LDPC code is very small, decoding of the parity check matrix of the LDPC is enabled through repetition decoding in case of a large block size. If the block size becomes considerably large, the parity check matrix of the LDPC code shows the performance that approximates a channel capacity limit of Shannon like a turbo code.

The LDPC code can be explained by a (n−k)×n parity check matrix H. And, a generator matrix G corresponding to the parity check matrix H can be found by Equation 1.

$$H \cdot G = 0 \quad \text{[Equation 1]}$$

In an encoding/decoding method using an LDPC code, a transmitting side encodes input data by Equation 2 using the generator matrix G having a relation of Equation 1 with the parity check matrix H.

$$c = G \cdot u, \quad \text{[Equation 2]}$$

where 'c' is a codeword and 'u' is a data frame.

Lately, a method of encoding input data using the parity check matrix H is globally used instead of the generator matrix G. Hence, as mentioned in the foregoing description, the parity check matrix H is the most important element in the encoding method using the LDPC code.

However, the parity check matrix H having a size approximately exceeding 1,000×2,000 needs lots of operations in the encoding and decoding processes, has difficulty in its implementation, and requires a considerably large storage space.

DISCLOSURE OF THE INVENTION

Accordingly, the present invention is directed to a method of encoding/decoding using an LDPC code and apparatus thereof that substantially obviate one or more of the problems due to limitations and disadvantages of the related art.

An object of the present invention is to provide a method of encoding/decoding using an LDPC code and apparatus thereof, by which a memory for storing a parity check matrix can be saved for the encoding or decoding using the LDPC code and by which encoding or decoding performance can be enhanced.

Another object of the present invention is to provide a method of generating an LDPC code, by which a memory for storing a parity check matrix in an encoding/decoding method using the LDPC code can be saved.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, a method of encoding/decoding input data using an LDPC (low density parity check) code according to the present invention includes the steps of generating a parity check matrix by expanding a base matrix including a permutation type defining a permutation matrix as at least one element, wherein the permutation matrix is generated from permutating a sequence of at least one of rows and columns of at least one base permutation matrix or rotating the at least one base permutation matrix, and encoding or decoding the input data using the parity check matrix.

To further achieve these and other advantages and in accordance with the purpose of the present invention, a method of generating an LDPC code, which is defined by an (n−k)×n matrix H, includes the steps of determining at least one z×z base permutation matrix or a z×z a z×z zero matrix (where z is an integer equal to or greater than 1), determining a (n−k)/z×n/z base matrix $H_b$ including information enabling the base permutation matrix to be permutated with each element according to a predetermined rule or information indicating the zero matrix (where n is a length of a codeword and k is a length of an information block), and generating the matrix H from expanding the base matrix by replacing the base permutation matrix or the zero matrix according to the information.

To further achieve these and other advantages and in accordance with the purpose of the present invention, in encoding input data using an LDPC code, an apparatus for encoding includes a parity check matrix generating module generating a parity check matrix by expanding a base matrix including a permutation type defining a permutation matrix as at least one element wherein the permutation matrix is generated from permutating a sequence of at least one of rows and columns of at least one base permutation matrix or rotating the at least one base permutation matrix, and an encoding module encoding the input data using the parity check matrix generated from the parity check matrix generating module.

To further achieve these and other advantages and in accordance with the purpose of the present invention, in decoding input data using an LDPC code, an apparatus for decoding includes a parity check matrix generating module generating a parity check matrix by expanding a base matrix including a permutation type defining a permutation matrix as at least one element wherein the permutation matrix is generated from permutating a sequence of at least one of rows and columns of at least one base permutation matrix or rotating the at least one base permutation matrix and a decoding module decoding the input data using the parity check matrix generated from the parity check matrix generating module.

Preferably, the permutation matrix defined by the permutation type is at least one base permutation matrix, a plurality of permutation matrices generated from permutating the sequence of one of the rows and columns of the at least one base permutation matrix or rotating the at least one base permutation matrix, or the zero matrix.

Preferably, each of the permutation types of the base matrix is expanded by being replaced by the permutation matrix defined by the corresponding permutation type, whereby the parity check matrix is generated.

Preferably, the permutation matrix is generated by a first class of shifting each of the rows or columns of the at least one base permutation matrix by a prescribed interval in a predetermined direction, a second class of exchanging a specific one of the rows for a random one of the rows, a third class of exchanging a specific one of the columns for a random one of the columns or a fourth class of rotating the at least one base permutation matrix by 90°, 180° or 270°.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 2 is a diagram of a parity check matrix H including a plurality of z×z permutation matrices or a zero matrix;

FIG. 3 is a diagram for explaining a method of configuring a plurality of permutation matrices by shifting all rows of a base permutation matrix with a predetermined interval in one preferred embodiment of the present invention;

FIG. 5 is a diagram for explaining a method of configuring a plurality of permutation matrices by exchanging a specific column of a base permutation matrix for another random column;

FIG. 6 is a diagram for explaining a method of configuring a plurality of permutation matrices by rotating a base permutation matrix at a specific angle;

FIGS. 7A to 7C are diagrams for explaining a method of generating a parity check matrix H using a base permutation matrix and a base matrix $H_b$ having information about types of permutation matrices generated from permutating the base permutation matrix according to a combination of four classes in the process of encoding or decoding data in a transmitting or receiving side; and FIGS. 8A to 8C are diagrams for explaining a method of generating a parity check matrix H using two base permutation matrix and a base matrix $H_b$ having information about types of permutation matrices generated from permutating the two base permutation matrices according to a combination of four classes in the process of encoding or decoding data in a transmitting or receiving side.

BEST MODE FOR CARRYING OUT THE INVENTION

Reference will now be made in detail to the preferred embodiments of the present invention, examples of which are illustrated in the accompanying drawings.

Figure 1A:
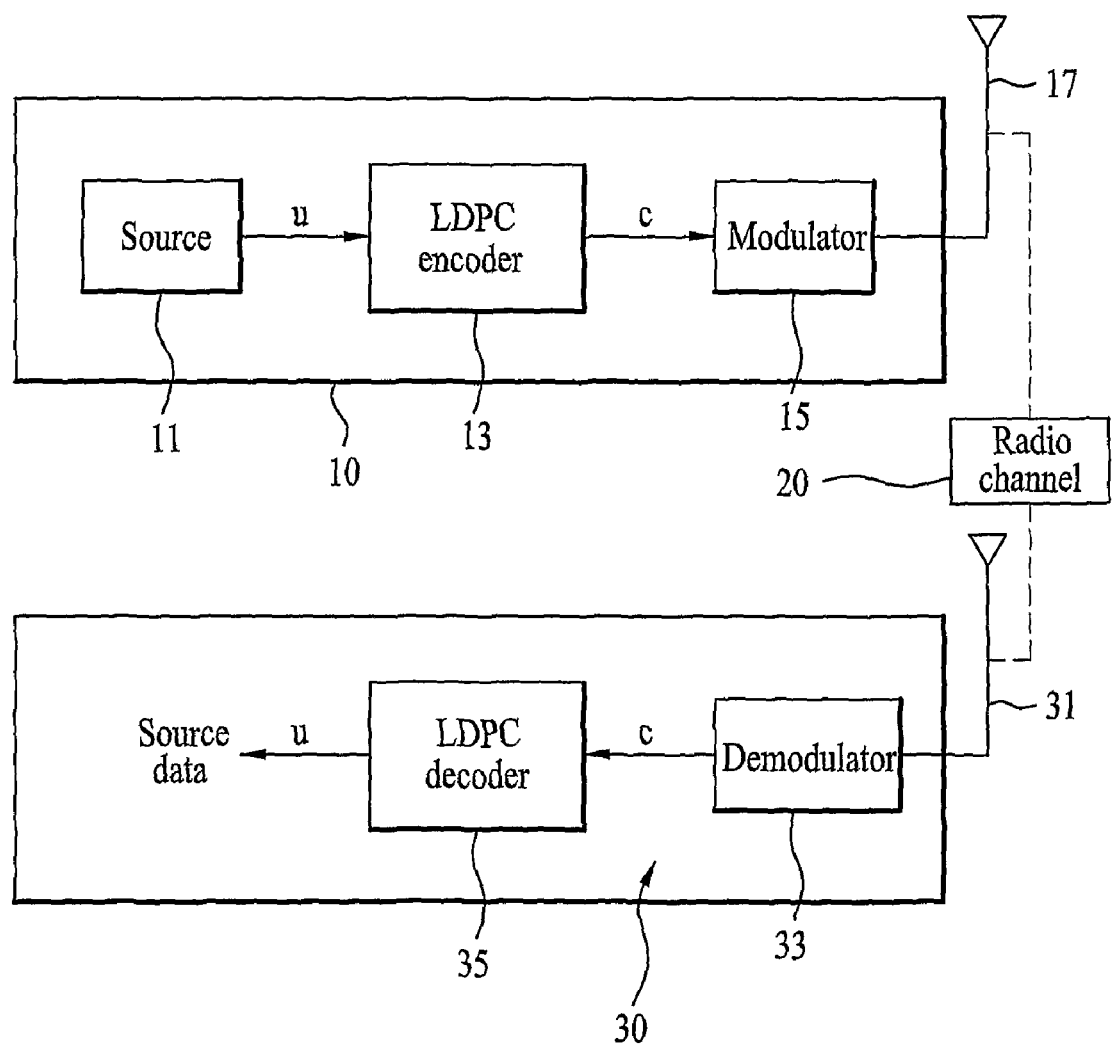
FIG. 1A is a block diagram of a communication system for explaining one preferred embodiment of the present invention.

FIG. 1A is a block diagram of a communication system to explain one preferred embodiment of the present invention, in which a technical feature of the present invention is applied to a wireless communication system for example.

Referring to FIG. 1A, a transmitter 10 and a receiver 30 communicate with each other using a radio channel as a medium. In the transmitter 10, a k-bit source data u outputted from a data source 11 is converted to an n-bit codeword c by LDPC encoding of an LDPC encoder 13. The codeword c is radio-modulated by a modulator 15, is transmitted by an antenna 17 via the radio channel 20, and is then received by another antenna 31 of the receiver 30. The receiver 30 goes through a process reverse to that of the transmitter 10. Namely, the source data u can be finally obtained in a manner of demodulation by a demodulator 33 and decoding by an LDPC decoder 35.

The above explained data transmitting/receiving process is described within a minimum range required for explaining the features of the present invention. So, it is apparent to those skilled in the art that the corresponding process needs more procedures for the data transmission/reception.

Figure 1B:
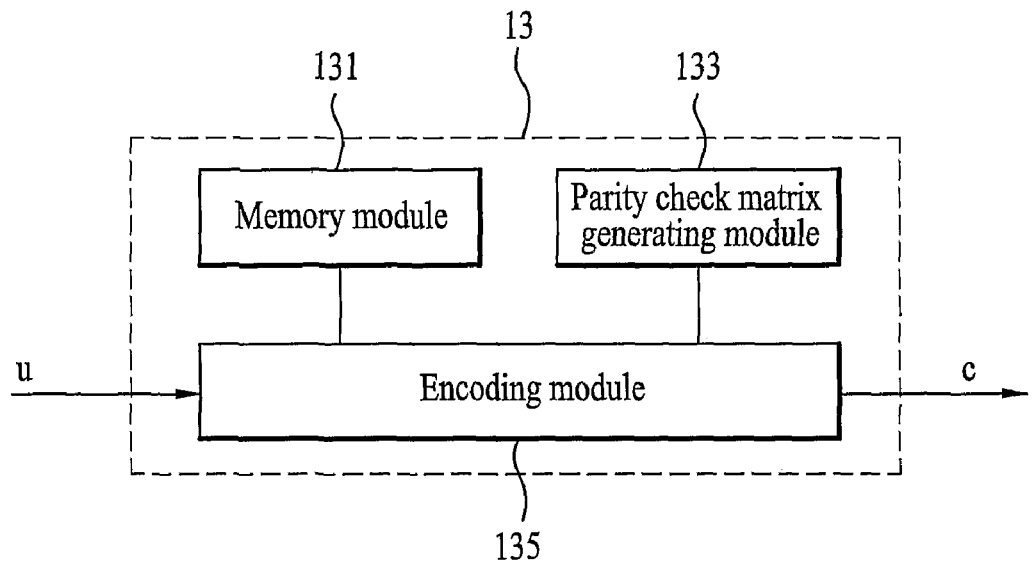
FIG. 1B is a detailed block diagram of an LDPC encoder shown in FIG. 1A.
Figure 1C:
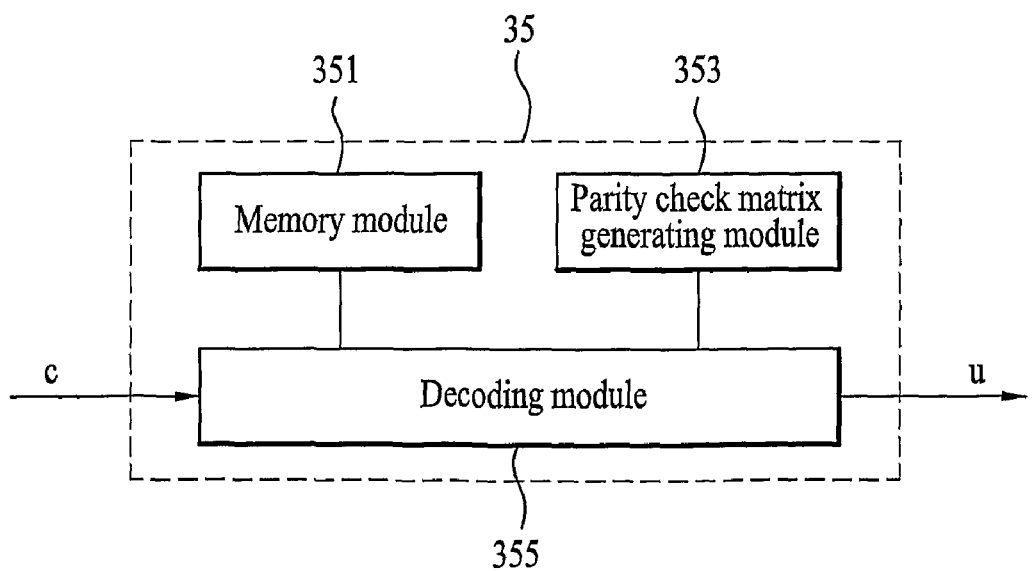
FIG. 1C is a detailed block diagram of an LDPC decoder shown in FIG. 1A.

FIG. 1B is a detailed block diagram of the LDPC encoder 13 shown in FIG. 1A and FIG. 1C is a detailed block diagram of the LDPC decoder 35 shown in FIG. 1A.

The parity check matrix H used for encoding the input source data in the LDPC encoder 13 is (n−k)×n dimensional. The 'k' means a length (bit unit) of the source data inputted to the LDPC encoder 13. The 'n' means a length (bit unit) of the encoded codeword c. The parity check matrix H, as shown in FIG. 2, comprises a plurality of z×z permutation matrices or a zero matrix. Namely, $P_{ij}$ in FIG. 2 means the z×z permutation matrix or zero matrix.

A plurality of the permutation matrices can be formed by permutating at least one base permutation matrix with a regularity. In a plurality of the permutation matrices including the at least one base permutation matrix, it is preferable that a row and column weight is '1'. Namely, one of elements of the entire rows and columns of the plurality of permutation matrices is '1' and the rest of the elements are '0'. The following four methods (classes) can be taken into consideration as the regularity in permutating the at least one base permutation matrix to configure the plurality of permutation matrices.

Figure 3:
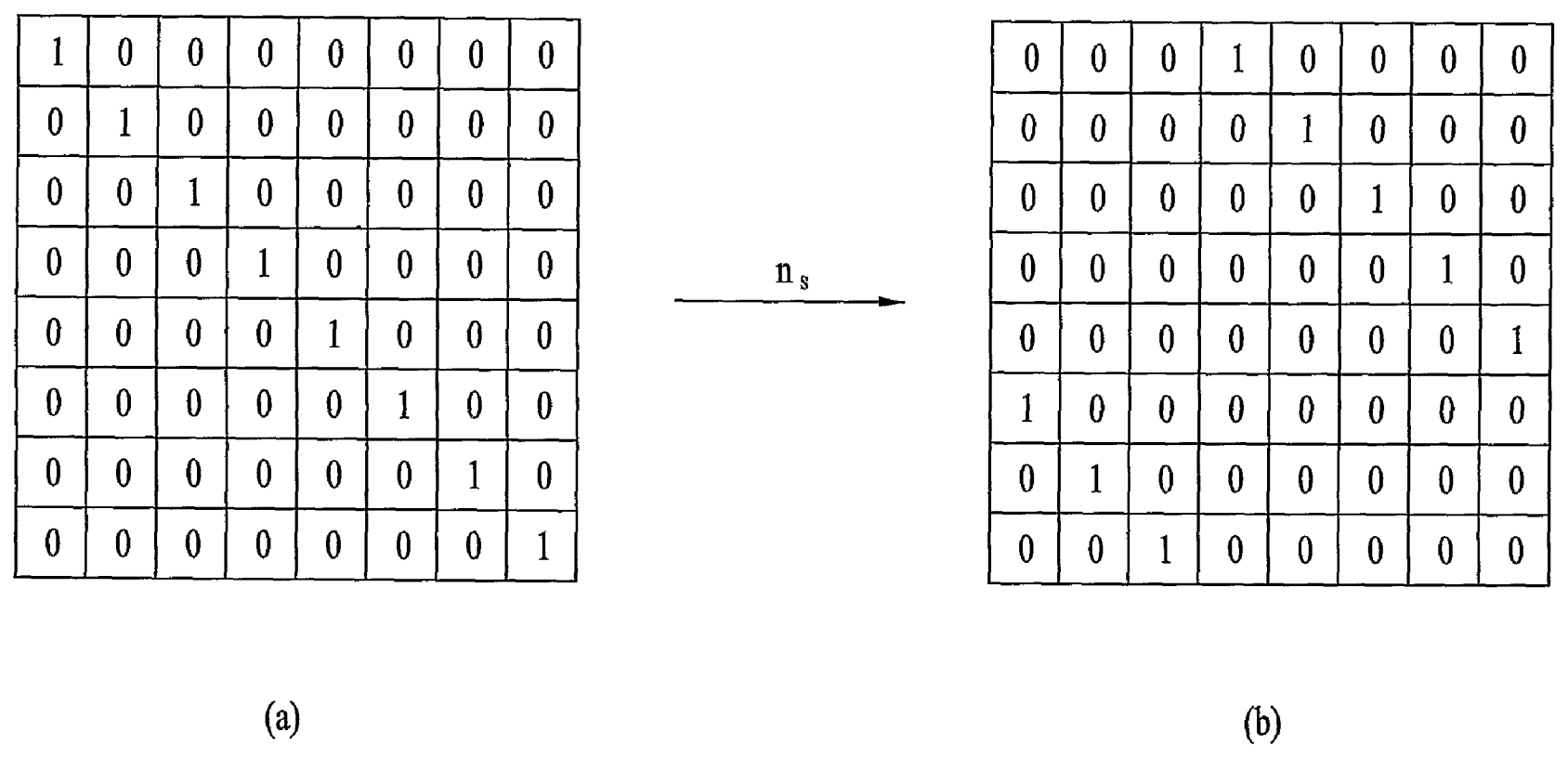

The first class corresponds to a method of shifting the entire rows (or, columns) of the base permutation matrix in a specific direction with a predetermined interval. FIG. 3 shows the corresponding example. Referring to FIG. 3, the entire rows of the base permutation matrix of (a) in FIG. 3 are shifted in a lower direction by five rows ($n_s=5$) (or, all columns are shifted to the right by three columns) to configure the permutation matrix of (b) in FIG. 3. By the first class, it is able to generate (z−1) permutation matrices according to an interval of the row or column shifted for a z×z base permutation matrix. Hence, z permutation matrices are generated if the base permutation matrix is included. Once the base permutation matrix is given, each of the z permutation matrices including the base permutation matrix can be expressed by one integer. For instance, by expressing the base permutation matrix as '0', by expressing a permutation matrix generated from shifting the entire rows of the base permutation matrix by one row in a specific direction as '1', and by expressing a permutation matrix generated from shifting the entire rows of the base permutation matrix by two rows as '2' and the like, it is able to express each of the permutation matrices as one integer.

Figure 4:
FIG. 4 is a diagram for explaining a method of configuring a plurality of permutation matrices by exchanging a specific row of a base permutation matrix for another random row.

The second class corresponds to a method of exchanging a specific row of the base permutation matrix for another random row. FIG. 4 shows the corresponding example. Referring to FIG. 4, by exchanging a first row of the base permutation matrix for a sixth row of the base permutation matrix, the permutation matrix of (a) shown in FIG. 4 is generated. In the second class, it is able to generate (z−1) permutation matrices according to which row is exchanged for a first row of a z×z base permutation matrix. Hence, z permutation matrices are generated if the base permutation matrix is included. Once the base permutation matrix is given, each of the z permutation matrices including the base permutation matrix can be expressed by one integer. For instance, by expressing the base permutation matrix as '0', by expressing a permutation matrix generated from exchanging the first row of the base permutation matrix for a second row of the base permutation matrix as '1', and by expressing a permutation matrix generated from exchanging the first row of the base permutation matrix for a third row of the base permutation matrix as '2' and the like, it is able to express each of the permutation matrices as one integer. In FIG. 4, the permutation matrix is generated by taking the first row as a reference to exchange for another random row. Yet, it is also able to obtain the same result if another random row is taken as a reference.

Figure 5:
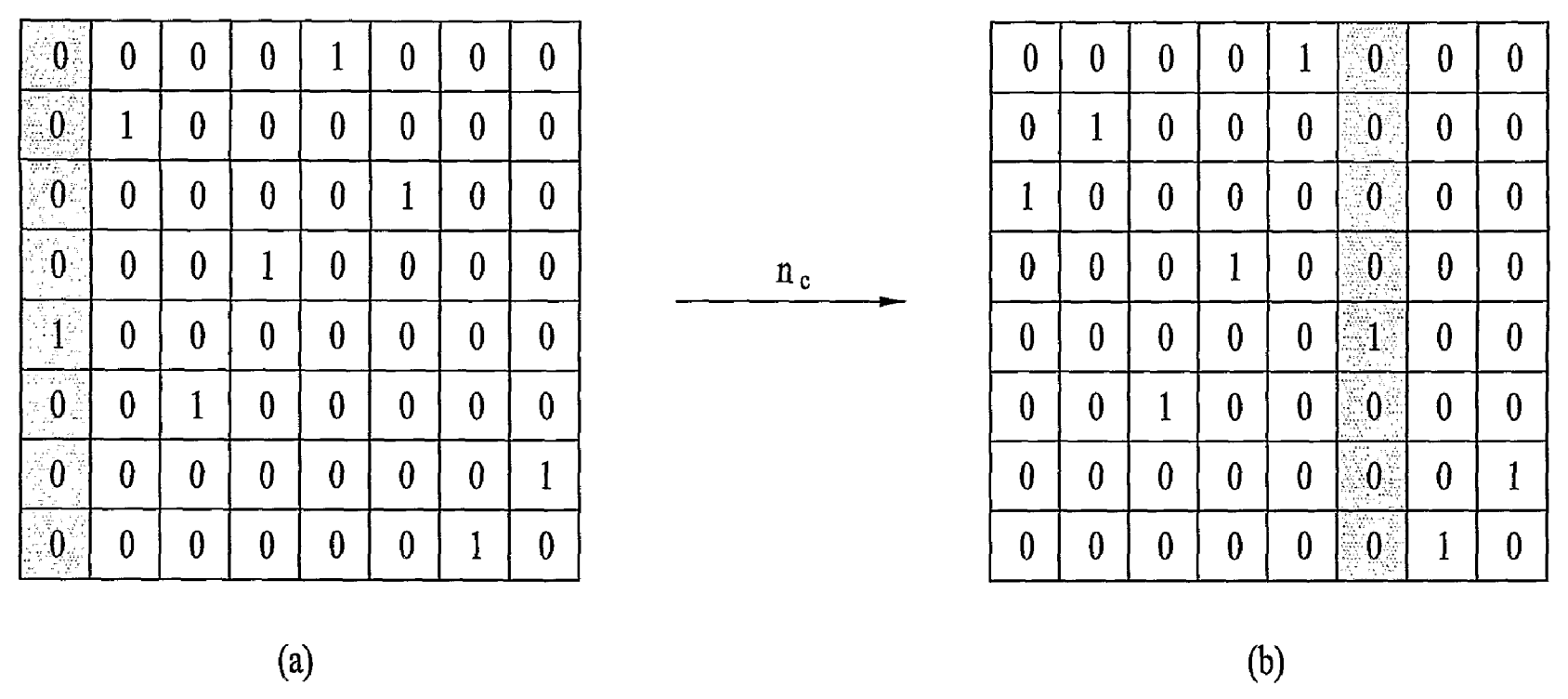

The third class corresponds to a method of exchanging a specific column of the base permutation matrix for another random column. FIG. 5 shows an example of the third class. Referring to FIG. 5, by exchanging a first column of the base permutation matrix for a sixth column of the base permutation matrix, the permutation matrix of (a) shown in FIG. 5 is generated. In the third class, it is able to generate (z−1) permutation matrices according to which column is exchanged for a first column of a z×z base permutation matrix. Hence, z permutation matrices are generated if the base permutation matrix is included. Once the base permutation matrix is given, each of the z permutation matrices including the base permutation matrix can be expressed by one integer. For instance, by expressing the base permutation matrix as '0', by expressing a permutation matrix generated from exchanging the first column of the base permutation matrix for a second column of the base permutation matrix as '1', and by expressing a permutation matrix generated from exchanging the first column of the base permutation matrix for a third column of the base permutation matrix as '2' and the like, it is able to express each of the permutation matrices as one integer. In FIG. 5, the permutation matrix is generated by taking the first column as a reference to exchange for another random column. Yet, it is also able to obtain the same result if another random column is taken as a reference.

Figure 6:
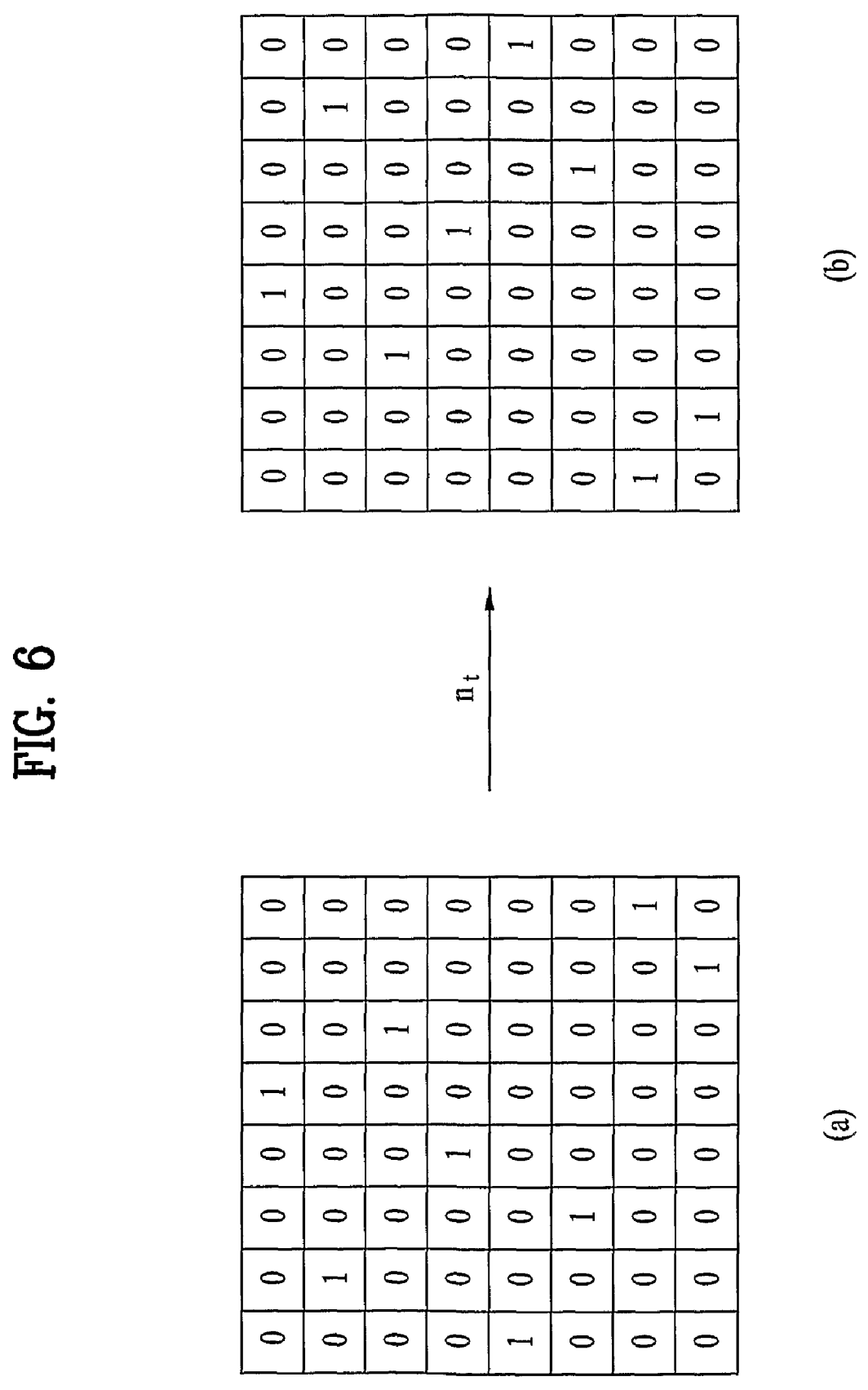

And, the fourth class corresponds to a method of generating a permutation matrix by rotating the base permutation matrix by 90°, 180° or 270°. FIG. 6 shows the corresponding example. Referring to FIG. 6, by rotating the base permutation matrix by 90°, the permutation matrix of (a) shown in FIG. 6 is generated. In the fourth class, it is able to generate three permutation matrices according to an angle by which a z×z base permutation matrix is rotated. Hence, four permutation matrices are generated if the base permutation matrix is included. Once the base permutation matrix is given, each of the four permutation matrices including the base permutation matrix can be expressed by one integer. For instance, by expressing the base permutation matrix as '0', by expressing a permutation matrix generated from rotating the base permutation matrix by 90° as '1', and by expressing a permutation matrix generated from rotating the base permutation matrix by 180° as '2' and the like, it is able to express each of the permutation matrices as one integer.

As mentioned in the foregoing description, each type of the plurality of permutation matrices generated from the base permutation matrix according to the four classes can be simply expressed as one integer. Such an integer as defining a z×z permutation matrix will be called a permutation type in the following description. 'Expressing the permutation type as an integer' is just exemplary. Alternatively, it is apparent that the permutation type can be expressed in various ways.

In a preferred embodiment of the present invention, it is unnecessary to store the parity check matrix H itself for performing the encoding or decoding. The base matrix $H_b$ having the permutation type as each element is stored and expanded into the parity check matrix H by replacing each element with a corresponding permutation matrix during performing the encoding or decoding. Hence, the present invention enhances performance of the encoding or decoding. And, the present invention can save the memory since the parity check matrix itself needs not to be stored.

As mentioned in the foregoing description, FIG. 1B and FIG. 1C are the detailed diagrams of the LDPC encoder 13 and the LDPC decoder 35 in FIG. 1A, respectively.

Referring to FIG. 1B and FIG. 1C, the LDPC encoder 13 includes a memory module 131 storing at least one base permutation matrix and a base matrix $H_b$, a parity check matrix generating module 133 expanding the base matrix to generate a parity check matrix H, and an encoding module 135 encoding input data using the parity check matrix generated from the parity check matrix generating module 133.

And, the LDPC decoder 35 includes a memory module 351 storing at least one base permutation matrix and a base matrix $H_b$, a parity check matrix generating module 353 expanding the base matrix to generate a parity check matrix, and an decoding module 355 decoding input data using the parity check matrix generated from the parity check matrix generating module 353.

In case of using a formal matrix such as an identity matrix as the base permutation matrix, the memory module 131 of the LDPC encoder 13 or the memory module 351 of the LDPC decoder 35 is capable of storing the base matrix $H_b$ only. The parity check matrix generating module 133 or 353 generates the parity check matrix H in a manner of expanding the base matrix $H_b$ by replacing each permutation type of the base matrix $H_b$ with a permutation matrix defined by the permutation type. The permutation matrix may correspond to the at least one base permutation matrix, a plurality of permutation matrices generated from permutating the at least one base permutation matrix according to the aforesaid first to fourth classes or a combination of the four classes, or a zero matrix. It is apparent to those having ordinary skill in the art the parity check matrix generating module 133 or 353 can be implemented by software or hardware.

The encoding module 135 encodes the input data using the parity check matrix generated from the parity check matrix generating module 133. And, there are various methods for encoding the input data using the parity check matrix. And, those methods are exemplarily explained as follows.

By Equation 1 and the relation of $H=[H_d|H_p]$, it can be known that $G=[I\ |(H_p^{-1}H_d)^t]^t$. Hence, the LDPC encoding module 135 performs encoding in a manner of multiplying the input data u by '$G=[I\ |(H_p^{-1}H_d)^t]^t$' according to Equation 2. Hence, Equation 2 can be replaced by Equation 3. In particular, a k-bit input source data $S_{1 \times k}$ is encoded into an n-bit codeword $x_{1 \times k}$ by Equation 2. A codeword x has a configuration of $x=[s\ p]=[s_0, s_1, \ldots, S_{k-1}, p_0, p_1, \ldots, P_{m-1}]$, where $(p_0, p_1, \ldots, p_{m-1})$ are parity check bits and $(s_0, s_1, \ldots, s_{k-1})$ are systematic bits.

$$c=[I\ |(H_p^{-1}H_d)^t]^t \cdot u \qquad \text{[Equation 1]}$$

Yet, the encoding scheme using the generator matrix G is very complicated. To reduce such complexity, it is preferable that the input source data is directly encoded using the parity check matrix H. Namely, since $x=[s\ p]$, $H \cdot x = H \cdot [s\ p]=0$ if using a characteristic of $H \cdot x=0$. From this equation, a parity check bit p can be obtained to finally find the code word $x=[s\ p]$.

The decoding module 355 of the LDPC decoder 35 uses Equation 4 in receiving to decode the data encoded in the above-explained manner.

$$H \cdot c = 0 \qquad \text{[Equation 4]}$$

Namely, if '0' results from multiplying an encoded data c by the parity check matrix H, it means that there is no transmission error. Otherwise, it means that a transmission error exists. Hence, the source data can be correspondingly separated.

Assuming that the base matrix $H_b$ is divided into two parts $H_d$ and $H_p$, the part $H_p$ can employ a block dual diagonal matrix in general. In the block dual diagonal matrix, a main diagonal and a diagonal beneath or directly above the main diagonal include identity matrices and the rest include zero matrices.

In selecting a method of generating the base permutation matrix and a plurality of different permutation matrices from the base permutation matrix, it is preferable that the generation of a short cycle such as a 4-cycle or 6-cycle is minimized in the entire parity check matrix H. Specifically, it is preferable that the parity check matrix H does not have the 4-cycle. Moreover, it is preferable that the parity check matrix H has the 6-cycle equal to or smaller than a preset critical value $C_{max}$. The 4-cycle means a case that two random rows of the parity check matrix H simultaneously have 1's at two points, respectively. The 6-cycle means a case that two combinable rows selected from three random rows of the parity check matrix H have 1's at the same points, respectively.

FIGS. 7A to 7C are diagrams for explaining a method of generating a parity check matrix H using a base permutation matrix and a base matrix $H_b$ having information about types of permutation matrices generated from permutating the base permutation matrix according to a combination of four classes in the process of encoding or decoding data in a transmitting or receiving side FIG. 7A shows a base permutation matrix having a row and column weight of 1, where z=5. And, FIG. 7B shows a base matrix $H_b$ including information about permutation types of permutation matrices generated from permutating the base permutation matrix according to a combination of the aforesaid four classes. In FIG. 7B, the permutation type included in the base matrix $H_b$ is represented by such a format as $(n_s, n_r, n_c, n_t)$. The format of $(n_s, n_r, n_c, n_t)$ means the corresponding permutation matrix is generated in a manner of shifting all rows or columns of the base permutation matrix by $n_s$, exchanging a specific row (e.g., $1^{st}$ row) for an $n_r^{th}$ row, and rotating the base permutation matrix by an angle corresponding to $n_t$. For instance, the permutation type (2, 0, 1, 0) means a new permutation matrix generated from shifting all rows or columns in the base permutation matrix shown in FIG. 7A by two rows or columns and exchanging the first and second rows with each other. '(−1)' in FIG. 7B means a 5×5 zero matrix. Hence, if the base permutation matrix shown in FIG. 7A and the base matrix $H_b$ including the permutation types defining the base permutation matrices shown in FIG. 7B, it is able to easily generate the parity check matrix H according to a predetermined rule or regularity. FIG. 7C shows the parity check matrix H generated from the base permutation matrix shown in FIG. 7A and the base matrix $H_b$ including the permutation types of the permutation matrices shown in FIG. 7B.

In the embodiment explained with reference to FIGS. 7A to 7C, the plurality of permutation matrices are generated from the base permutation matrix by a combination of the aforesaid four classes. Instead, the plurality of permutation matrices can be generated by one of the four classes or by a combination of the two or three classes. In case that the plurality of permutation matrices are generated from one of the four classes, the type of the permutation matrix can be expresses as one integer. In case that the plurality of permutation matrices are generated from two of the four classes, the type of the permutation matrix can be expressed as two integers. In case that the plurality of permutation matrices are generated from the combination of the three classes, the type of the permutation matrix can be expressed as three integers.

For example, by combining the method of shifting the entire rows or columns of the base permutation matrix of the first class by a predetermined interval with the method of rotating the base permutation matrix by a predetermined angle, it is able to simplify the permutation type included in the base matrix $H_b$ to $(n_s, n_r)$ from $(n_s, n_r, n_c, n_t)$. Moreover, if the predetermined angle is set to 90°, the type of the permutation matrix can be expressed as one integer s. In this case, 's' is an integer corresponding to one of 0, 1, . . . , (z−1), z, (z+1), . . . , (2×z−1). Namely, z matrices generated from shifting the z×z base permutation matrix by the predetermined interval and another z matrices generated from rotating the former matrices in a predetermined direction by 90° can be expressed as one integer s. A z×z identity matrix can preferably be used as the base permutation matrix. In the above example, the permutation matrix type included in the base matrix $H_b$ can be simplified and the LDPC code is represented using the simple information to save the memory for the LDPC code storage and to provide the optimal performance.

FIGS. 8A to 8C are diagrams for explaining a method of generating a parity check matrix H using two base permutation matrix and a base matrix $H_b$ having information about types of permutation matrices generated from permutating the two base permutation matrices according to a combination of four classes in the process of encoding or decoding data in a transmitting or receiving side.

The embodiment to be explained with reference to FIGS. 8A to 8C differs from the aforesaid embodiment with reference to FIGS. 7A to 7C in that a plurality of different permutation matrices are generated from two base permutation matrices and in that a permutation type included in a base matrix $H_b$ is expressed as a format of $(n_0, n_s, n_r, n_c, n_t)$ as shown in FIG. 8B. The meanings of '$n_s$, $n_r$, $n_c$ and $n_t$' are identical to the above-explained meanings. And, '$n_0$' is the information indicating that the plurality of different permutation matrices are generated based on which one of the two base permutation matrices.

In FIG. 8B, '(−1)' means a 5×5 zero matrix. And, FIG. 8C shows the parity check matrix H generated from the base matrix $H_b$ including the information of the types of the two base permutation matrices shown in FIG. 8A and the permutation matrix shown in FIG. 8B.

In generating the plurality of different permutation matrices based on the two base permutation matrices, one of the four classes or a combination of two or threes of the four classes can be used as well. And, it is also apparent that the number of the base permutation matrices corresponds to at least three.

Accordingly, the present invention needs not to store the parity check matrix occupying a memory having a considerably big capacity in encoding or decoding input data, thereby saving the memory and thereby enhancing the encoding/decoding performance.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

INDUSTRIAL APPLICABILITY

Accordingly, the present invention is applicable to such a wireless communication system as a mobile communication system, a broadband wireless access system and the like and is further applicable to all kinds of fields needing the encoding or decoding.

What is claimed is:

1. A method of encoding/decoding input data using a low density parity check (LDPC) code, the method comprising:
   providing a base matrix and at least two base permutation matrices, each element of the base matrix indicating a permutation type which identifies a base permutation matrix and a permutation matrix,
   wherein the base permutation matrix is selected among the at least two base permutation matrices, and
   wherein the permutation matrix is generated by:
      shifting rows of the base permutation matrix in a predetermined direction by a predetermined interval,
      exchanging a specific row of the base permutation matrix with another row,
      exchanging a specific column of the base permutation matrix with another column, and
      rotating the base permutation matrix by 90°, 180°, or 270°;
   generating a parity check matrix by replacing each element of the base matrix with a permutation matrix identified by a corresponding permutation type; and
   encoding or decoding the input data using the parity check matrix.

2. The method of claim 1, wherein the base matrix further comprises a permutation type identifying a zero matrix.

3. An apparatus for encoding input data using a low density parity check (LDPC) code, the apparatus comprising:
   a memory module configured to store a base matrix and at least two base permutation matrices, each element of the base matrix indicating a permutation type which identifies a base permutation matrix and a permutation matrix,
   wherein the base permutation matrix is selected among the at least two base permutation matrices, and
   wherein the permutation matrix is generated by:
      shifting rows of the base permutation matrix in a predetermined direction by a predetermined interval,
      exchanging a specific row of the base permutation matrix with another row,
      exchanging a specific column of the base permutation matrix with another column, and
      rotating the base permutation matrix by 90°, 180°, or 270°;
   a parity check matrix generating module configured to generate a parity check matrix by replacing each element of the base matrix with a permutation matrix identified by a corresponding permutation type; and
   an encoding module configured to encode the input data using the parity check matrix generated from the parity check matrix generating module.

4. The apparatus of claim 3, wherein the base matrix further comprises a permutation type identifying a zero matrix.

5. An apparatus for decoding input data using a low density parity check (LDPC) code, the apparatus comprising:
   a memory module configured to store a base matrix and at least two base permutation matrices, each element of the base matrix indicating a permutation type which identifies a base permutation matrix and a permutation matrix,
   wherein the base permutation matrix is selected among the at least two base permutation matrices, and
   wherein the permutation matrix is generated by:
      shifting rows of the base permutation matrix in a predetermined direction by a predetermined interval,
      exchanging a specific row of the base permutation matrix with another row,
      exchanging a specific column of the base permutation matrix with another column, and
      rotating the base permutation matrix by 90°, 180°, or 270°;
   a parity check matrix generating module configured to generate a parity check matrix by replacing each element of the base matrix with a permutation matrix identified by a corresponding permutation type; and
   a decoding module configured to decode the input data using the parity check matrix generated from the parity check matrix generating module.

6. The apparatus of claim 5, wherein the base matrix further Comprises a permutation type identifying a zero matrix.

* * * * *